United States Patent [19]

André

[11] Patent Number: 5,014,232
[45] Date of Patent: May 7, 1991

[54] ADAPTIVE DIGITAL FILTER HAVING NON-RECURSIVE AND RECURSIVE FILTER ELEMENTS

[75] Inventor: Tore M. André, Bandhagen, Sweden
[73] Assignee: Telefonaktiebolaget L M Ericsson, Stockholm, Sweden
[21] Appl. No.: 334,712
[22] Filed: Apr. 7, 1989

[30] Foreign Application Priority Data

Jun. 3, 1988 [SE] Sweden .................................. 8802076

[51] Int. Cl.⁵ ............................................ G06F 15/31
[52] U.S. Cl. ............................ 364/724.19; 364/724.17
[58] Field of Search ........................ 364/724.17, 724.16, 364/724.19, 724.2; 375/14; 333/166

[56] References Cited

U.S. PATENT DOCUMENTS

| | | | |
|---|---|---|---|
| 4,495,591 | 1/1985 | Loomis, Jr. | 364/724.17 |
| 4,520,491 | 5/1985 | Raulin | 375/27 |
| 4,521,867 | 6/1985 | Kasuga | 364/724.17 |
| 4,539,690 | 9/1985 | Speidel | 375/14 |
| 4,791,390 | 12/1988 | Harris et al. | 364/724.17 |
| 4,803,647 | 2/1989 | Dieterich | 364/724.17 |
| 4,811,360 | 3/1989 | Potter | 364/724.2 |

FOREIGN PATENT DOCUMENTS 0253583 1/1988 European Pat. Off. .
3610382 10/1987 Fed. Rep. of Germany .
2102255 1/1983 United Kingdom .

Primary Examiner—David H. Malzahn
Attorney, Agent, or Firm—Burns, Doane, Swecker & Mathis

[57] ABSTRACT

An adaptive digital filter including a non-recursive part and a recursive part, and which can be updated in a simple and reliable manner. The recursive part of the filter has a plurality of separate, permanently set recursive filters (13-16) with different impulse responses, and a linear combination is formed with adaptive weighting factors (W0-W3) from the output signals of the recursive filters (13-16). The filter is updated by a single (e(n)) being utilized for updating the non-recursive part (11) of the filter and the adaptive weighting factors (W0-W3) in the recursive part of the filter.

12 Claims, 5 Drawing Sheets

ADAPTIVE DIGITAL FILTER HAVING NON-RECURSIVE AND RECURSIVE FILTER ELEMENTS

FIELD OF THE INVENTION

The invention relates to an adaptive, digital filter including a non-recursive part and a recursive part. Uses of the filter are such as echo canceller or equalizer in telecommunication equipment.

BACKGROUND OF THE INVENTION

The impulse response from a filter which is used for echo cancellation in telecommunication equipment shall as closely as possible immitate the impulse response of the transmission line in question. Included in the transmission line in such a case are two-wire to four-wire junctions, analogue-digital converters etc, which affect the impulse response. The latter generally has relatively long extension in time. It is therefore difficult to achieve a suitable impulse response with a filter which only has a finite impulse response. Such filters are called non-recursive filters or FIR filters (finite impulse response). For achieving a suitable impulse response, a filter for echo cancellation should comprise both a non-recursive part and a recursive part. Recursive filters are also called IIR filters (infinite impulse response).

There are known, reliable methods for updating adaptive FIR filters, i.e. adjusting the coefficients of such filters. They can be updated by minimizing the square of an error signal, which constitutes the difference between a so-called desired signal and the output signal of the filter. In such a case the desired signal may be a signal occurring on the receiver side in communication equipment where the filter is included. The square of the error signal can be minimized, e.g. according to the so-called LMS method (least mean square). The LMS method is described inter alia in the book: Widrow and Stearns, "Adaptive signal processing", pp 99–101.

Minimizing the square of an error signal according to the above is a so-called least square problem, due to the square of the error signal being a quadratic function of the filter coefficient values. This means that this square can be represented by a quadratic error surface, in an N-dimensional space where N is the number of coefficients, the optimum filter setting corresponding to the minimum point on this surface.

The corresponding square for an IIR filter is not represented by a quadratic error surface according to the above, however, and the error surface can have local minimum points instead. Known updating algorithms can fasten in such a local minimum point, resulting in that the optimum setting is never obtained.

Recursive filters can also be instable, as a result of that the poles in the Z transform of the transfer function can at least temporarily be moved outside the unit circle. For an IIR filter of the first degree, this means that the filter coefficient can be an amount greater than one, which makes the filter instable.

It is known to use a so-called "equation error" structure to avoid the problem with local minimii. In such a case two FIR filters are used, inter alia, of which one is connected to a transmitter side and the other to a receiver side in the same telecommunication equipment. An error signal is formed by the output signal of one filter being subtracted from the output signal of the other. The square of this error signal has a quadratic error surface, but a structure of this kind has the disadvantage that the minimized error signal does not represent the actual error. This is so, inter alia, when disturbances occur and when speech signals occur on the transmitter and receiver sides simultaneously. It has also been found difficult to adjust two filters which are connected in this way, due to the filters affecting each other. The equation error method is described, e.g. in the above-mentioned book "Adaptive signal processing", pp 250–253.

SUMMARY OF THE INVENTION

The object of the present invention is to provide an adaptive digital filter which includes a non-recursive part and a recursive part, and which can be updated in a simple and reliable way. This is achieved by the recursive part of the filter having a plurality of separate, permanently set recursive filters with different impulse responses, and in that a linear combination with adaptive weighting factors is formed by the output signals of the recursive filter. The filter is updated by a single signal being utilized for updating the non-recursive part and the adaptive weighting factors in the recursive part. A stable filter is also obtained in this way, due to the poles of the recursive filter not being displaced.

The characterizing features of the invention are apparent from the claims.

BRIEF DESCRIPTION OF DRAWINGS

The invention will now be described in more detail and with reference to the drawings, where.

DETAILED DESCRIPTION OF THE PREFERRED EMBODIMENTS

Figure 1:
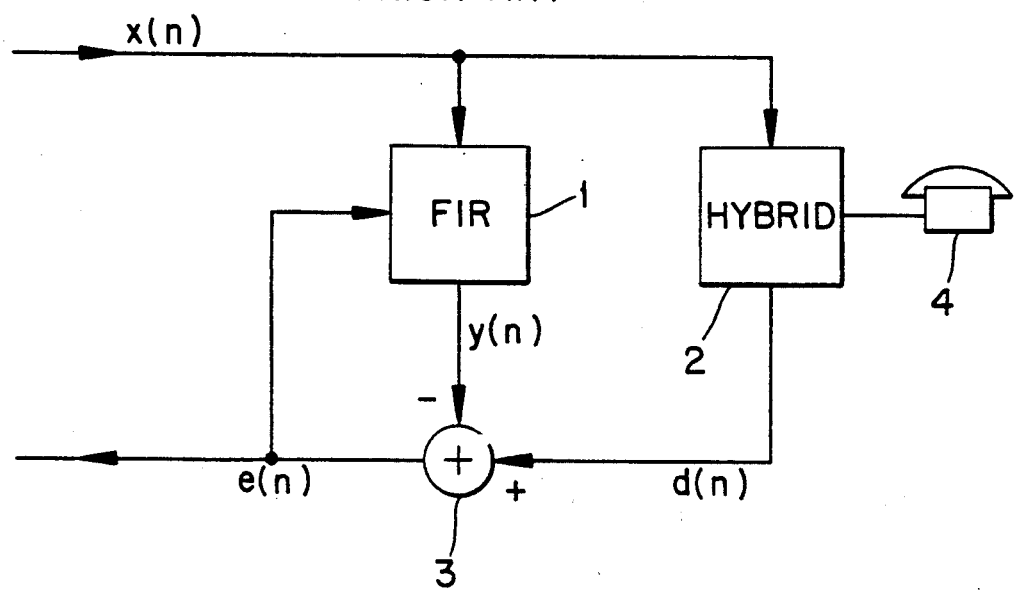
FIG. 1 illustrates a known apparatus for echo cancellation.

A known apparatus for echo cancellation is illustrated in FIG. 1. A digital input signal x(n) occuring on the transmission side of telecommunication equipment is applied to a two-wire to four-wire junction 2, i.e. a hybrid, which is connected to a receiver side in the telecommunication equipment and across a two-wire line to a telephone set 4. Echo signals occur in the hybrid and in the two-wire line. The output signal to the receiver side from the hybrid 2 is denoted d(n) and consists solely of echo signals when no signal is received from the telephone set 4. This signal agrees with the above-mentioned desired signal.

The input signal x(n) is also applied to an adaptive FIR filter 1, which generates an expected echo signal y(n). An error signal e(n) is formed in summing means 3, this signal being the difference between the signals d(n) and y(n), and is utilized for updating the filter. As will be seen from the above, an FIR filter can be updated according to known methods, e.g. the LMS method.

The impulse response of the filter is however generally too short for effective echo cancellation to be obtained.

Figure 2:
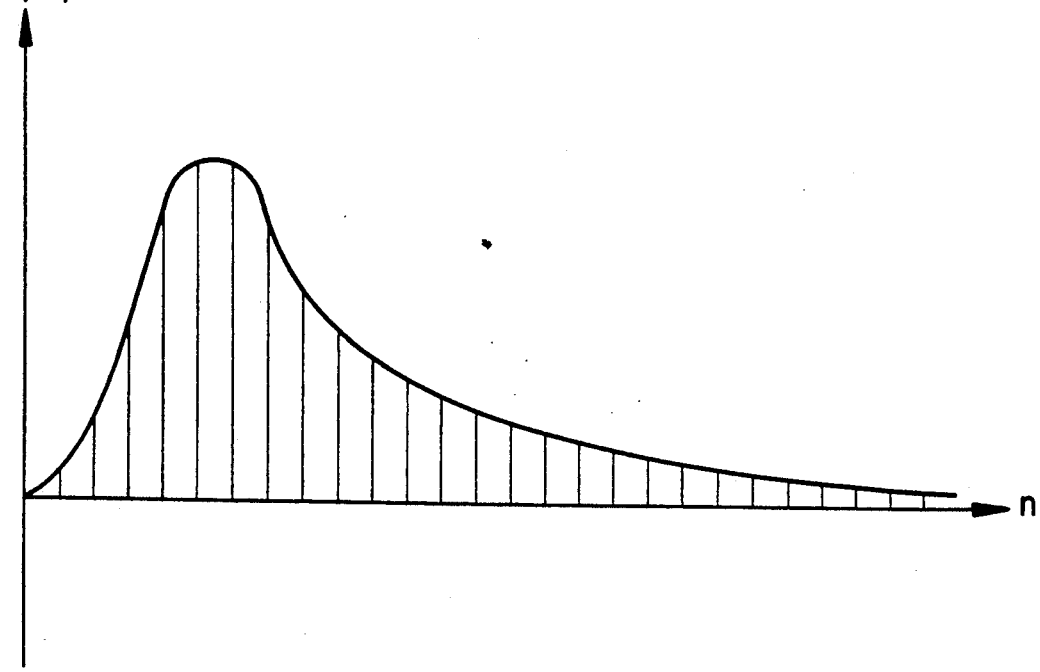
FIG. 2 illustrates an example of a desired impulse response from a filter in accordance with the invention.

In FIG. 2 there is illustrated an example of a desired impulse response h(n) with relatively long extension in time, where n denotes the sequential number for the respective sample value. The impulse response can be divided into two main parts. There is first a considerable transient containing the greater part of the signal energy of the impulse. There is then a long, and substantially exponentially decaying part, a so-called tail. Negative values can also occur in the impulse response.

Figure 3:
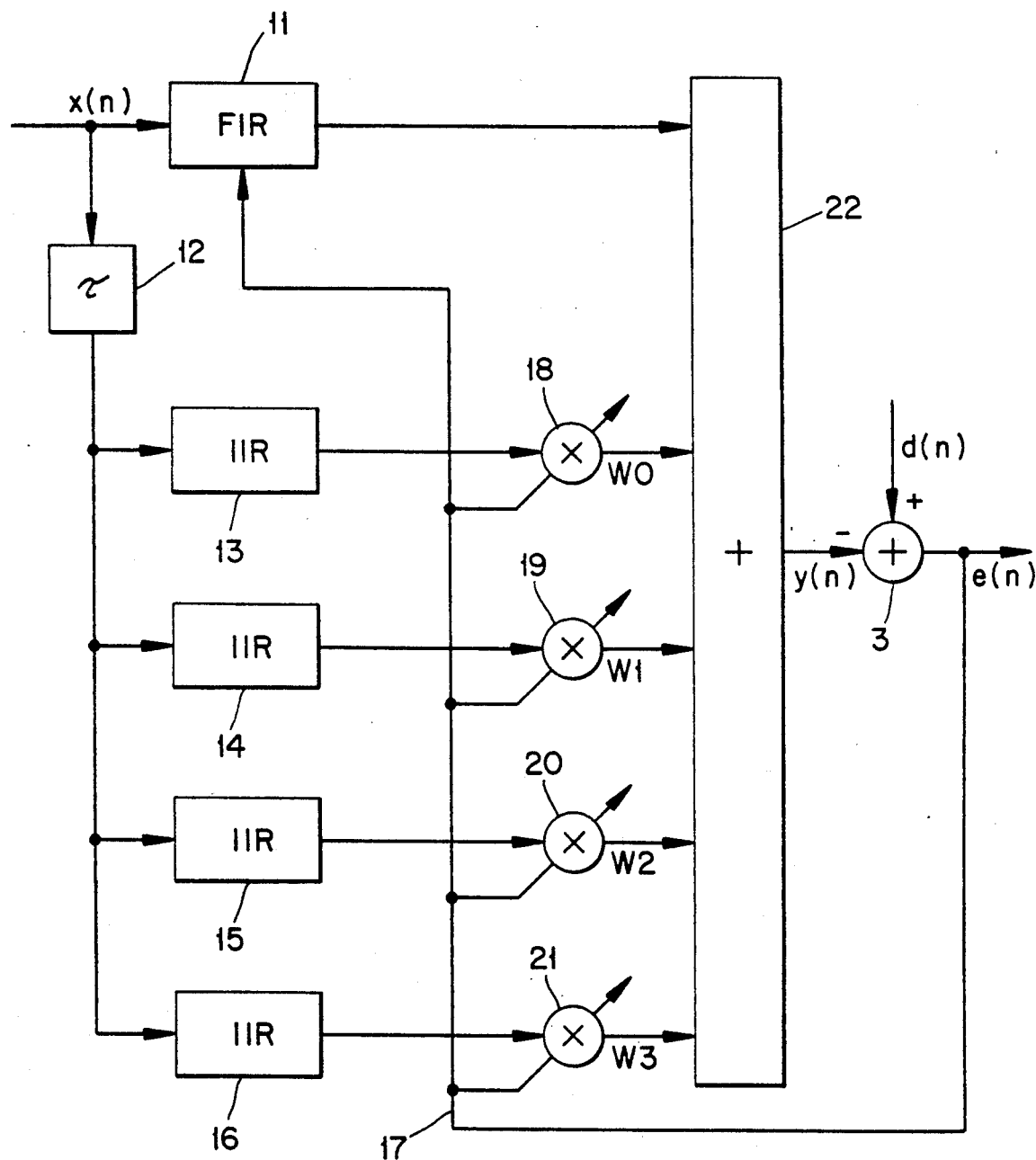
FIG. 3 illustrates a first embodiment example of a filter in accordance with the invention.

A first embodiment example of a filter in accordance with the invention is illustrated in FIG. 3. The filter obtains a digital signal x(n) as input signal, this signal corresponding, for example, to the signal x(n) in the apparatus according to FIG. 1. The input signal is applied to an FIR filter 11 directly, and to a plurality of IIR filters 13-16 after delay by a time $\tau$ in a delay means 12. The IIR filters are suitably of the first degree, and have permanently set filter coefficients having mutually differing values. The output signal from the FIR filter 11 is supplied to a summing means 22, and the output signals from the IIR filters 13-16 are each applied to their respective multiplication means 18-21. Each of the latter has an adaptive multiplication factor. These multiplication factors are assumed to have the values W0-W3, and they are adjusted in the way given below. The output signals from the FIR filter 11 and from the multiplication means 18-21 are finally added in the summing means.

In accordance with the inventive concept, the first part of the impulse response is generated in the FIR filter 11 and the second part is generated as a linear combination of the output signals from the IIR filters 13-16. The weightings in the linear combination are here determined by the adaptive multiplication factors, or weighting factors W0-W3. By suitable delay of the input signal x(n) to the IIR filters, both parts of the impulse response can be generated independently of each other. The filters in accordance with the invention thus comprise two separate filter parts, a non-recursive filter part and a recursive filter part, the output signals of which are added.

The filter output signal is denoted y(n) and is subtracted from an arbitrary desired signal d(n) in a summing means 3. A difference signal e(n) thus obtained occurs on a line 17 and is utilized both for updating the non-recursive filter part, i.e. the FIR filter 11, and the recursive filter part. Updating the latter takes place by updating the adaptive weighting factors W0-W3 of the multiplication means 18-21. The signals y(n), d(n) and e(n) and the summing means 3 agree with corresponding signals and means in FIG. 1, for example, but the field of application of the filter is of course not limited to echo cancellation. For the sake of completeness, it is pointed out that updating means are required both for the FIR filter 11 and the multiplication means 18-21, these updating means being generally known in connection with digital filters.

Figure 4:
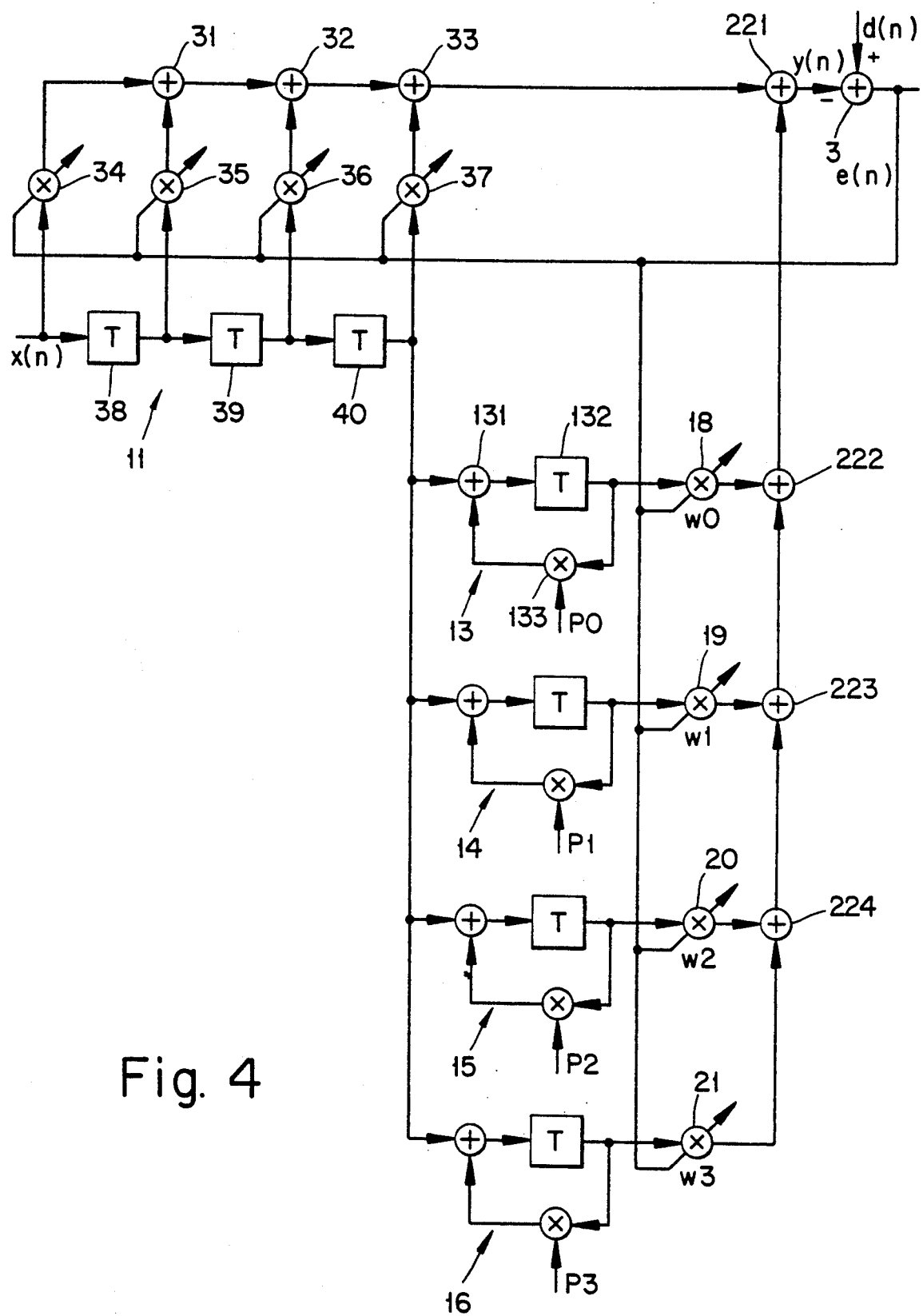
FIG. 4 illustrates a more detailed embodiment of the filter according to FIG. 3.
Figure 5A:
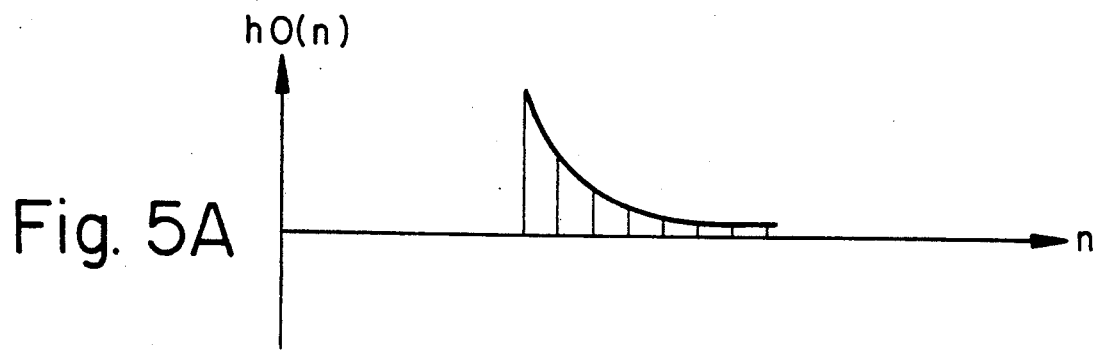
FIG. 5 is a series of graphs giving examples of different impulse responses in certain individual filters included in the filter in accordance with the invention and FIG. 6 illustrates a second embodiment example of a filter in accordance with the invention.
Figure 5B:
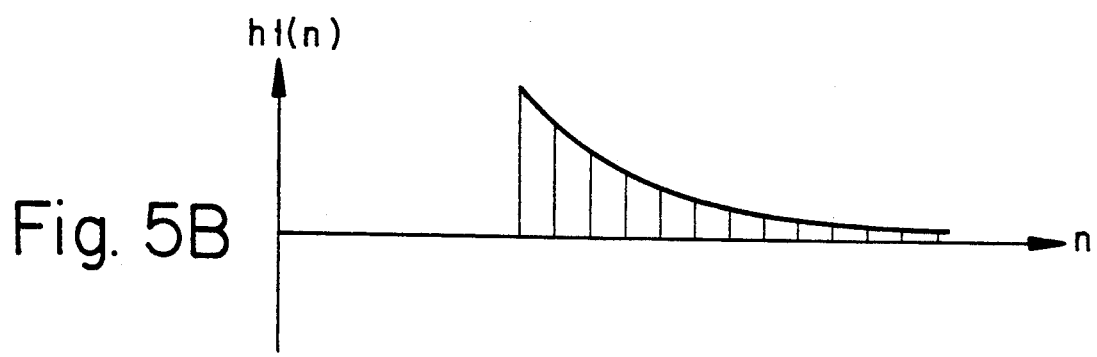
Figure 5C:
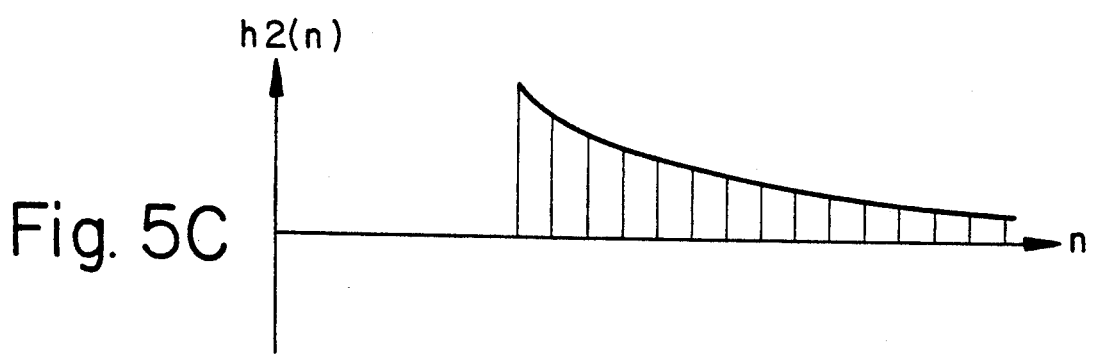
Figure 5D:
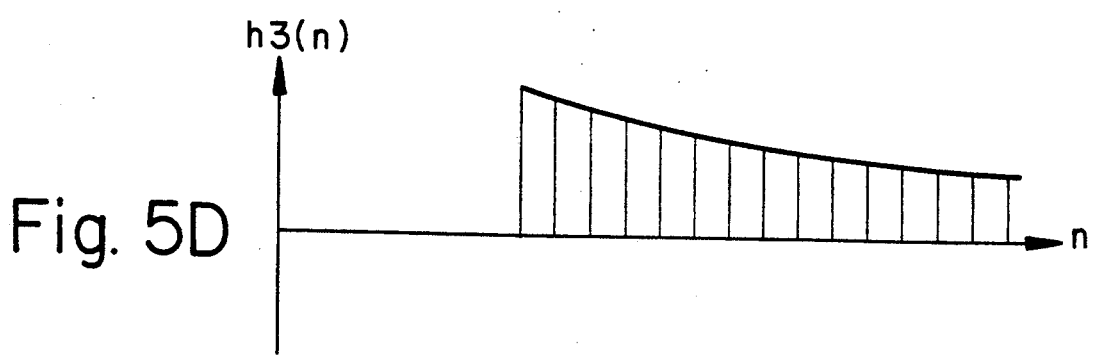

There is shown in FIG. 4 a more detailed embodiment of the filter according to FIG. 3. The FIR filter 11 conventionally comprises delay means 38-40, multiplication means 34-37, and summing means 31-33. The IIR filters 13-16 are of the first degree, and each has its permanently set filter coefficient. These filters are also implemented conventionally and each comprises a summing means, e.g. 131, a delay means, e.g. 132, and a multiplication means, e.g. 133. The multiplication means are each allocated a permanently set coefficient P0-P3, which have mutually different values, and which are thus the filter coefficients of the IIR filters.

Each of the delay means 38-40 included in the FIR filter 11 delay the input signal x(n) by a sample value, and together these correspond to the delay means 12 illustrated in FIG. 3. In the illustrated example, $\tau = 3\,T$. Such a separate delay means is thus not required in practise but can be included in the FIR filter instead. The summing means 22 in FIG. 3 is shown in FIG. 4 as a plurality of separate summing means 221-224.

As will be seen from above, the difference signal e(n) is used for both updating the FIR filter 11 and the adaptive weighting factors W0-W3 of the multiplication means 18-21 in the recursive filter part. The problem of minimizing the difference signal e(n) is equal to minimizing the sum of the square of the expression $W0 \times P0^n + W1 \times P1^n + W2 \times P2^n + W3 \times P3^n - f(n)$, where n goes from zero to infinity, P0-P3 are the permanent recursive filter coefficients and f(n) is the desired impulse response. This sum has a quadratic error area with only one minimum, since the weighting factors are only present linearly in the expression. This means that the recursive filter part can be updated according to the same method as the non-recursive filter part, e.g. according to the LMS method.

Some of the advantages achieved with the filter in accordance with the invention are that the difference signal is represented by a quadratic error area, simultaneously as the difference signal represents the actual error (as opposed to an equation error structure). In addition, the recursive filter part is always stable, since the poles of the individual IIR filters are not displaced. This depends in turn on that the filter coefficients P0-P3 are permanent.

Some graphs are illustrated in FIG. 5, and are examples of different impulse responses of the individual IIR filters in the recursive part of the filter. The transfer functions of the IIR filters 13-16 are denoted in turn by h0(n)-h3(n). It is assumed that the input signal to the filters is delayed by a plurality of sample values corresponding to the length of the impulse response of the FIR filter. The filter coefficients P0-P3 are, according to the example, 0.5, 0.75, 0.875 and 0.9375. The transfer functions will then be: $h0(n)=0.5^n$, $h1(n)=0.75^n$ etc. Other coefficient values can of course be selected.

The part of the entire desired impulse response occurring to the left of the impulse responses illustrated in FIG. 5, i.e. earlier than these, is generated in the FIR filter 11. This is adapted such that its output signal ceases when the impulse responses according to FIG. 5 start. It is pointed out, however, that the number of delay means in the FIR filter included in the filter according to FIG. 4 is not adapted to the graphs in FIG. 5.

By linearly combining a plurality of given impulse responses in the way described above, it is possible to achieve impulse responses of very varying forms. Both positive and negative weighting factors W0-W3 can thus occur, of course. The long decaying part of the desired impulse response cannot always be imitated exactly. This does not make so much difference, however, since only a relatively small part of the energy of the entire desired impulse response is in this part. On the other hand, the first, major part of the impulse response which is generated by the FIR filter can be imitated rather precisely.

Figure 6:
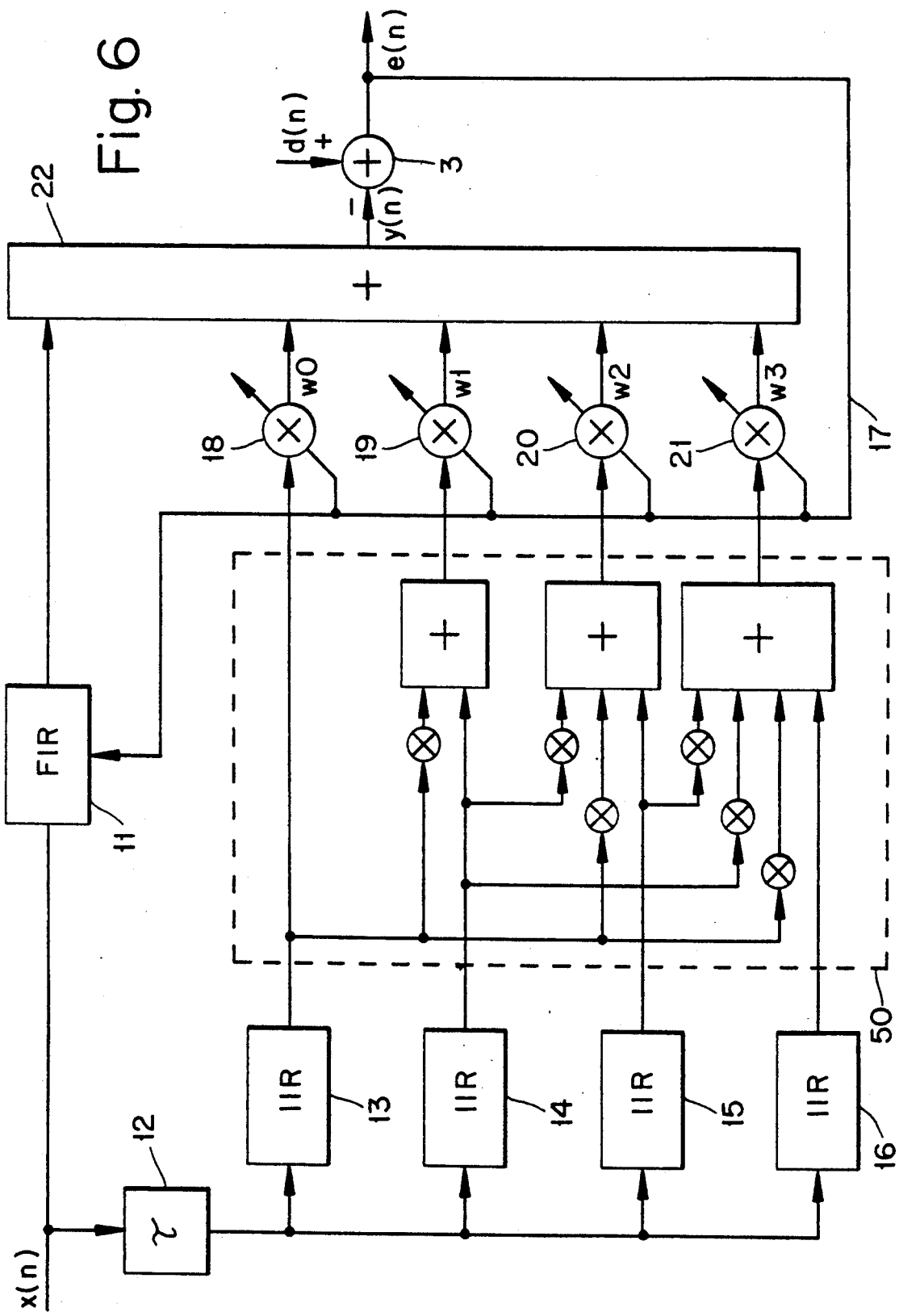

A second embodiment example of a filter in accordance with the invention is illustrated in FIG. 6. Further to the means included in the filter according to FIG. 3, there is also a network denoted by 50 in this filter. The network 50 includes multiplication means and summing means, which are adapted to form linear combinations of the output signals of the IIR filters 13-16. These means are connected such that the multiplication means 18 obtains the output signal from the filter 13 in an unaltered condition. The multiplication means 19 obtains the sum of the output signal from the filter 14 and the output signal from the filter 13 multiplied by a factor, and so on, according to the Figure. The linear combinations can be selected such that the input signals to the multiplications means 18, 21 will be orthogonal. These orthogonal impulse responses are then weighted by adaptive weighting factors, as with the filters according to FIGS. 3 and 4. A change in a given weighting factor does not necessarily cause a change in the remaining weighting factors in this case. More rapid convergence is thus obtained. The number of calculations increases somewhat, however.

The filter in accordance with the invention can be used in different connections, when a relatively long impulse response is desired and not only for adaptive echo cancellation. Of course, the number of IIR filters may be both more or less than just four, as illustrated in the examples. The implementation of the FIR and IIR filters can also be different from what has been shown in the examples. Neither is it necessary to delay the input signal to the IIR filters. However, the delay results in that the first part of the desired impulse response is generated solely by the FIR filter, and that the second part of the response is generated solely by the recursive filter part.

I claim:

1. An adaptive digital filter for filtering digital input signals, comprising:
    non-recursive filtering means for non-recursively filtering said input signals;
    recursive filtering means for recursively filtering said input signals, said recursive filtering means including:
    a plurality of preset recursive filters each recursive filter having a different impulse response characteristic;
    a plurality of multiplication means, associated with said plurality of recursive filters, for multiplying an output signal of each recursive filter by a corresponding adaptive multiplication factor; and
    summing means for forming a linear combination of output signals from said multiplication means;
    means for generating an update signal on the basis of an output signal from said summing means and an output from said non-recursive filtering means; and
    updating means for updating both said non-recursive filtering means and said adaptive multiplication factors in accordance with said update signal.

2. The adaptive filter according to claim 1, wherein said recursive filters are of the first degree.

3. The adaptive filter according to claim 2, further comprising:
    delay means connected to said input signal, for delaying said input signal to said recursive filtering means for a predetermined delay period.

4. The adaptive filter according to claim 1, further comprising:
    combining means for linearly combining output signals from said recursive filters and transmitting linear combinations of said recursive filter output signals to said plurality of multiplication means.

5. An adaptive digital filter for filtering a digital input signal, comprising:
    non-recursive filtering means for non-recursively filtering said input signal;
    recursive filtering means for recursively filtering said input signal;
    summing means for summing output signals from said non-recursive filtering means and said recursive filtering means;
    error generating means for calculating a difference between an output signal from said summing means and a reference signal;
    adjusting means for adjusting said non-recursive filtering means and said recursive filtering means based on said difference.

6. The adaptive filter according to claim 5, wherein said non-recursive filtering means includes:
    a plurality of first delay means for generating a series of first delayed input signals;
    a plurality of weighting means for weighting said first delay inputs, wherein said adjusting means adjusts the value of each weighting means.

7. The adaptive digital filter according to claim 5, wherein said recursive filtering means includes plural recursive filters, each recursive filter having a preset impulse response characteristic.

8. The adaptive filter according to claim 7, wherein each recursive filter includes:
    summing means for summing said input signal and a feedback signal;
    second delay means for delaying an output signal of said summing means;
    multiplication means for multiplying an output signal of said second delay means by a preset constant and generating said feedback signal; and
    weighting means for weighting an output signal of said second delay means, said adjusting means adjusting the value of said weighting means in accordance with said difference.

9. The adaptive digital filter according to claim 8, further comprising:
    combining means for linearly combining the output signals of each of said weighting means to generate a linear combination of the infinite impulse responses of said recursive filters.

10. The adaptive digital filter according to claim 8, further comprising:
    combining means for linearly combining recursive output signals of said second delay means and transmitting linear combinations of said recursive output signal to said plurality of weighting means.

11. An adaptive digital filter for filtering a digital input signal, comprising:
    non-recursive filtering means having a finite impulse response for filtering said input signal;
    recursive filtering means having an infinite impulse response for filtering said input signal;
    summing means for summing output signals from said non-recursive filtering means and said recursive filtering means;
    differencing means for calculating a difference between an output signal from said summing means and a desired signal;
    adjusting means for adjusting said non-recursive filtering means and said recursive filtering means relative to said difference.

12. The adaptive digital filter according to claim 11, wherein said recursive filtering means includes a plurality of recursive filters of the first degree.

* * * * *